US009741626B1

(12) United States Patent
Cheng et al.

(10) Patent No.: US 9,741,626 B1
(45) Date of Patent: Aug. 22, 2017

(54) VERTICAL TRANSISTOR WITH UNIFORM BOTTOM SPACER FORMED BY SELECTIVE OXIDATION

(71) Applicant: INTERNATIONAL BUSINESS MACHINES CORPORATION, Armonk, NY (US)

(72) Inventors: Kangguo Cheng, Schenectady, NY (US); Nicolas J. Loubet, Guilderland, NY (US); Xin Miao, Guilderland, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/298,966

(22) Filed: Oct. 20, 2016

(51) Int. Cl.
*H01L 21/8238* (2006.01)
*H01L 29/423* (2006.01)
(Continued)

(52) U.S. Cl.
CPC .. *H01L 21/823885* (2013.01); *H01L 21/3085* (2013.01); *H01L 21/30604* (2013.01);
(Continued)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66772; H01L 29/66818; H01L 29/7858; H01L 27/11273; H01L 29/41741; H01L 29/66272; H01L 29/66674; H01L 29/66712; H01L 29/7395; H01L 29/7396; H01L 29/7397; H01L 29/7788; H01L 29/7802; H01L 29/7827; H01L 29/78639
See application file for complete search history.

(56) References Cited

U.S. PATENT DOCUMENTS 5,087,581 A 2/1992 Rodder
5,963,817 A 10/1999 Chu et al.
(Continued)

FOREIGN PATENT DOCUMENTS

CN 100570894 C 12/2009
WO 2005079182 A2 9/2005

OTHER PUBLICATIONS

E Memišević et al., "Thin electron beam defined hydrogen silsesquioxane spacers for vertical nanowire transistors," Journal of Vacuum Science & Technology B, vol. 32, No. 5, 2014, 051211, 6 pages.
(Continued)

*Primary Examiner* — Eduardo A Rodela
(74) *Attorney, Agent, or Firm* — Cantor Colburn LLP; Vazken Alexanian (57) ABSTRACT

A method of forming a vertical transistor includes forming at least one fin on stacked layers. The stacked layers include a substrate, a doped silicon layer, and an intrinsic layer interposed between the pair of fins and the substrate. The method further includes forming a spacer hardmask over the pair of fins, and forming a bottom spacer. Forming the bottom spacer includes selective oxidation of the SiGe layer.

8 Claims, 12 Drawing Sheets

(51) Int. Cl.

| | | |
|---|---|---|
| *H01L 29/78* | (2006.01) | |
| *H01L 29/06* | (2006.01) | |
| *H01L 29/417* | (2006.01) | |
| *H01L 29/66* | (2006.01) | |
| *H01L 21/306* | (2006.01) | |
| *H01L 21/308* | (2006.01) | |
| *H01L 29/788* | (2006.01) | |
| *H01L 27/112* | (2006.01) | |
| *H01L 29/778* | (2006.01) | |

(52) U.S. Cl.
CPC .... *H01L 27/11273* (2013.01); *H01L 29/0649* (2013.01); *H01L 29/41741* (2013.01); *H01L 29/41791* (2013.01); *H01L 29/4236* (2013.01); *H01L 29/66272* (2013.01); *H01L 29/66553* (2013.01); *H01L 29/66795* (2013.01); *H01L 29/7788* (2013.01); *H01L 29/785* (2013.01); *H01L 29/7889* (2013.01)

(56) References Cited

U.S. PATENT DOCUMENTS

| | | |
|---|---|---|
| 7,683,428 B2 | 3/2010 | Chidambarrao et al. |
| 8,637,849 B2 | 1/2014 | Deligianni et al. |
| 9,190,466 B2 | 11/2015 | Basker et al. |
| 9,299,835 B1 | 3/2016 | Anderson et al. |
| 2013/0260561 A1* | 10/2013 | Ranjan ............ H01L 21/02112 438/696 |
| 2014/0191297 A1* | 7/2014 | Utomo ............... H01L 29/7855 257/288 |
| 2015/0001591 A1* | 1/2015 | Akarvardar .......... H01L 29/785 257/288 |
| 2016/0099338 A1 | 4/2016 | Chang et al. |
| 2016/0172460 A1* | 6/2016 | Basker ............. H01L 29/66795 257/288 |

OTHER PUBLICATIONS

H. V. Mallela et al., "Vertical Field Effect Transistors With Metallic Source/Drain Regions," U.S. Appl. No. 15/140,763, filed Apr. 28, 2016.

K. Cheng et al., "Fabrication of Vertical Field Effect Transistor Structure With Controlled Gate Length," U.S. Appl. No. 15/087,074, filed Mar. 31, 2016.

V. D. Kunz et al., "Reduction of parasitic capacitance in vertical MOSFETs by spacer local oxidation," IEEE Transactions on Electron Devices, vol. 50, No. 6, 2003, pp. 1487-1493.

\* cited by examiner

VERTICAL TRANSISTOR WITH UNIFORM BOTTOM SPACER FORMED BY SELECTIVE OXIDATION

BACKGROUND

The present invention relates in general to semiconductor devices, and more specifically, to vertical-type transistors having uniform bottom spacer thickness and methods of fabricating the same.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint. While some FET performance characteristics are improved in contemporary vertical FET designs, other vertical FET device performance characteristics can be compromised.

SUMMARY

According to a non-limiting embodiment, a method of forming a vertical transistor is described. The method includes forming at least one fin on stacked layers. The stacked layers include a substrate, a doped silicon layer, and an intrinsic layer interposed between the pair of fins and the substrate. The method further includes forming a spacer hardmask over the at least one fin, and forming a bottom spacer. Forming the bottom spacer includes selective oxidation of the intrinsic layer.

According to a non-limiting embodiment of the present invention, a vertical transistor includes at least one fin on stacked layers. The stacked layers include a substrate, a doped silicon layer, and an intrinsic layer interposed between the pair of fins and the substrate. The vertical transistor further includes a spacer hardmask over the at least one fin, and a selectively oxidized bottom spacer integrated with the intrinsic layer.

Additional features are realized through the techniques of embodiments of the present invention. Other embodiments are described in detail herein and are considered a part of the claimed invention. For a better understanding of embodiments, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of embodiments of the present invention are apparent from the following detailed description taken in conjunction with non-limiting embodiments illustrated in the accompanying drawings. FIGS. 1-12 are a series of views illustrating a vertical FET device having a bottom spacer formed by selective oxidation, and a method of forming a vertical FET device with a selectively oxidized bottom spacer according to exemplary embodiments of the present teachings, in which:

DETAILED DESCRIPTION

Various embodiments of the present invention are described herein with reference to the related drawings. Alternative embodiments can be devised without departing from the scope of this description. It is noted that various connections and positional relationships (e.g., over, below, adjacent, etc.) are set forth between elements in the following description and in the drawings. These connections and/or positional relationships, unless specified otherwise, can be direct or indirect, and the embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments will now be provided. Although specific fabrication operations used in implementing one or more embodiments can be individually known, the described combination of operations and/or resulting structures are unique. Thus, the unique combination of the operations described in connection with embodiments of the present invention utilizes a variety of individually known physical and chemical processes performed on a semiconductor (e.g., silicon) substrate. In general, the various processes used to form a micro-chip that will be packaged into an IC fall into three categories, namely, film deposition, patterning, etching, and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Vertical-type transistors such as vertical FETs have recently been developed to achieve a reduced FET device footprint without compromising necessary FET device performance characteristics. A vertical FET has a channel perpendicular to the substrate surface as opposed to a conventional FET, which has a channel extending substantially parallel to the substrate surface. Forming the bottom spacer of a vertical FET by directional deposition techniques (e.g., high-density plasma deposition (HDP), physical vapor deposition (PVD), or gas clustering ion beam deposition (GCIB), etc.) can be problematic due to fin tapering and the high aspect ratio of the fin structure. Although directional deposition onto a structure should result in deposition on the co-planar surfaces perpendicular to the direction of the deposition, in practice deposition can affect the non-planar surfaces as well. Thus, additional etching processes are needed to remove the parasitic deposition on the non-planar surfaces, which results in bottom spacer thickness variation. This invention teaches forming the bottom spacer of a vertical FET using a selective oxidization process which addresses the bottom spacer thickness variation issue related with the conventional methods as described above.

Turning now to an overview of aspects of the present invention, one or more embodiments provide fabrication methods and resulting structures for a vertical FET having uniform spacers formed by selective oxidation.

Figure 1:
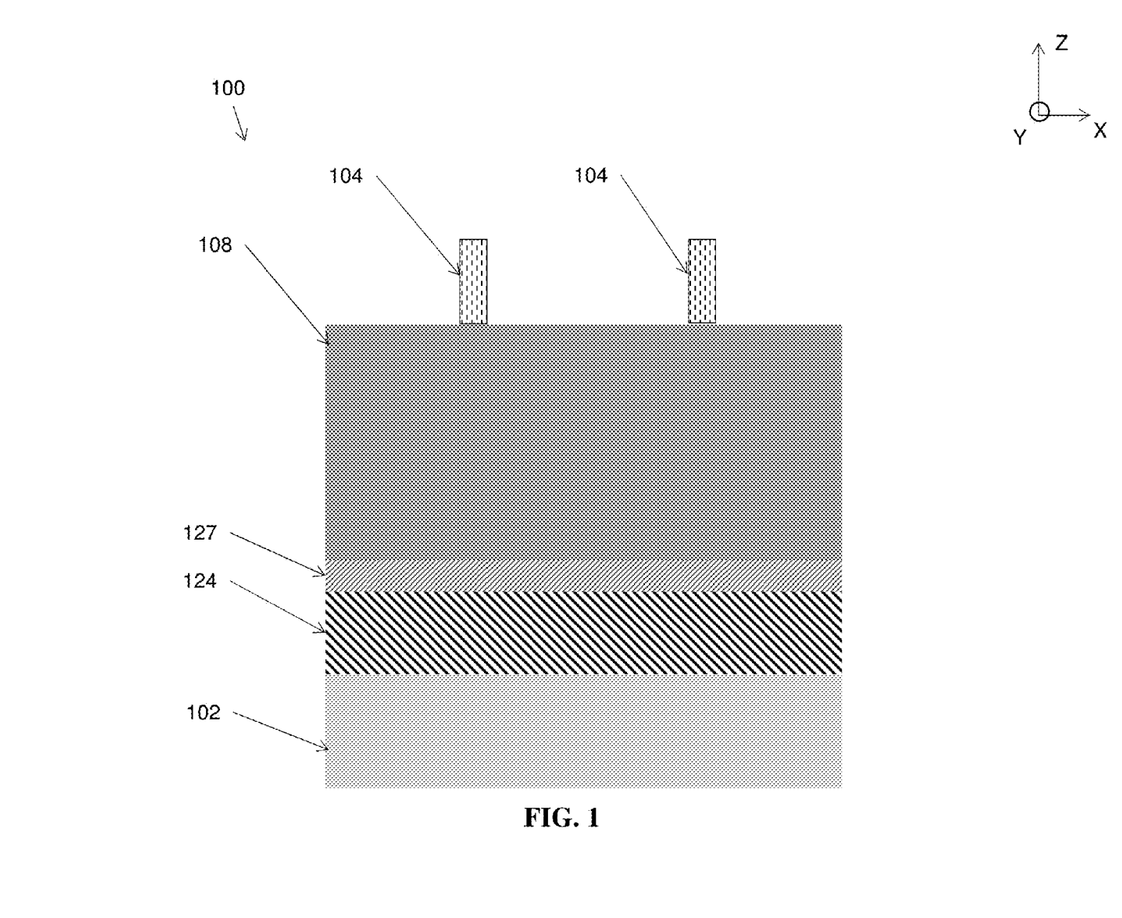
FIG. 1 is a cross-sectional view of a starting semiconductor structure having a semiconductor substrate according to a non-limiting embodiment.

Turning now to a more detailed description of one or more embodiments, with reference to FIG. 1, a semiconductor structure 100 for fabricating a vertical-type semiconductor device such as a vertical FET, for example, is illustrated according to a non-limiting embodiment. Generally, with respect to x-y-z view orientation, the semiconductor structure 100 extends along a first axis (e.g., a Z-axis) to define a vertical height, a second axis (e.g., an X-axis) to define a distance of a first side (i.e., a first side distance). A Y-axis arrow extends into the page, as shown in FIG. 1. Semiconductor structure 100 includes an epitaxy of stacked layers, including a semiconductor substrate 102, doped semiconductor layer 124, an intrinsic silicon germanium (SiGe) layer 127, and an intrinsic silicon layer 106 from which fins 108 are formed.

The semiconductor structure 100 includes a semiconductor substrate 102. The semiconductor substrate 102 can include a bulk semiconductor substrate or a semiconductor-on-insulator (SOI) substrate as understood by one of ordinary skill in the art. In one non-limiting embodiment, the material of the semiconductor substrate is silicon (Si). Other semiconductor substrates are also conceived. The semiconductor substrate 102 can include other structures (not shown) such as isolation, doped wells that can be formed by techniques well known in the art.

As shown in FIG. 1, according to one non-limiting embodiment, doped semiconductor layer 124 can be formed on semiconductor substrate 102 and have a vertical thickness ranging, for example, from approximately 10 nm to approximately 100 nm. Various epitaxial growth processes can be used to grow the doped semiconductor layer 124. For example, the doped semiconductor layer 124 can be epitaxially grown using chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The doped semiconductor layer 124 serve as bottom S/D regions, which are located over the semiconductor substrate 102. The semiconductor layer 124 can be doped using any suitable doping technique such as ion implantation, plasma doping, in-situ doped epitaxy growth, solid phase doping, liquid phase doping, gas phase doping, etc. In some embodiments, a thermal anneal is performed after doping in order to activate the dopants. In some embodiments, the thermal anneal step is skipped. In some embodiments, the doped semiconductor layer 124 can have the same material as the semiconductor substrate 102 or different material from the semiconductor substrate 102. For example, the doped semiconductor layer 124 can be silicon germanium or silicon doped with p-type dopants such as boron, gallium, indium for p-type transistors. The doped semiconductor layer 124 can be silicon germanium or silicon doped with n-type dopants such as phosphorus, arsenic, antimony for n-type transistors.

Semiconductor structure 100 further includes an intrinsic silicon germanium (SiGe) layer 127. FIG. 1 depicts one embodiment of forming intrinsic SiGe layer 127 on doped semiconductor layer 124. An intrinsic $Si_{1-x}Ge_x$ (SiGe) layer 127 is subsequently grown by means of selective epitaxy using a process gas containing $GeH_4$ at a process temperature of between 550 and 700° C. SiGe layer 127 is formed to a layer thickness of 3 nm to 20 nm, for example, with a germanium content x of 0.25. SiGe layer 127 can alternatively be formed to a different thickness with a different germanium content x. Other processes for forming intrinsic SiGe layer 127 are contemplated.

As depicted in FIG. 1, an intrinsic semiconductor layer is formed on top of SiGe layer 127. Intrinsic semiconductor layer material is used to form a plurality of fins 108. The intrinsic semiconductor layer (fins 108) also serves a channel material for semiconductor structure 100. Hardmasks 104 are formed on an upper surface of intrinsic semiconductor layer 108. The hardmasks 104 are formed by forming a masking layer on the upper surface of intrinsic semiconductor layer 108. The masking layer can include a photosensitive material that is deposited using, for example, a spin coating process followed by photolithography. The masking layer can be, for example, a nitride hardmask. Alternatively, the masking layer can include a hardmask layer such as amorphous carbon.

Figure 2:
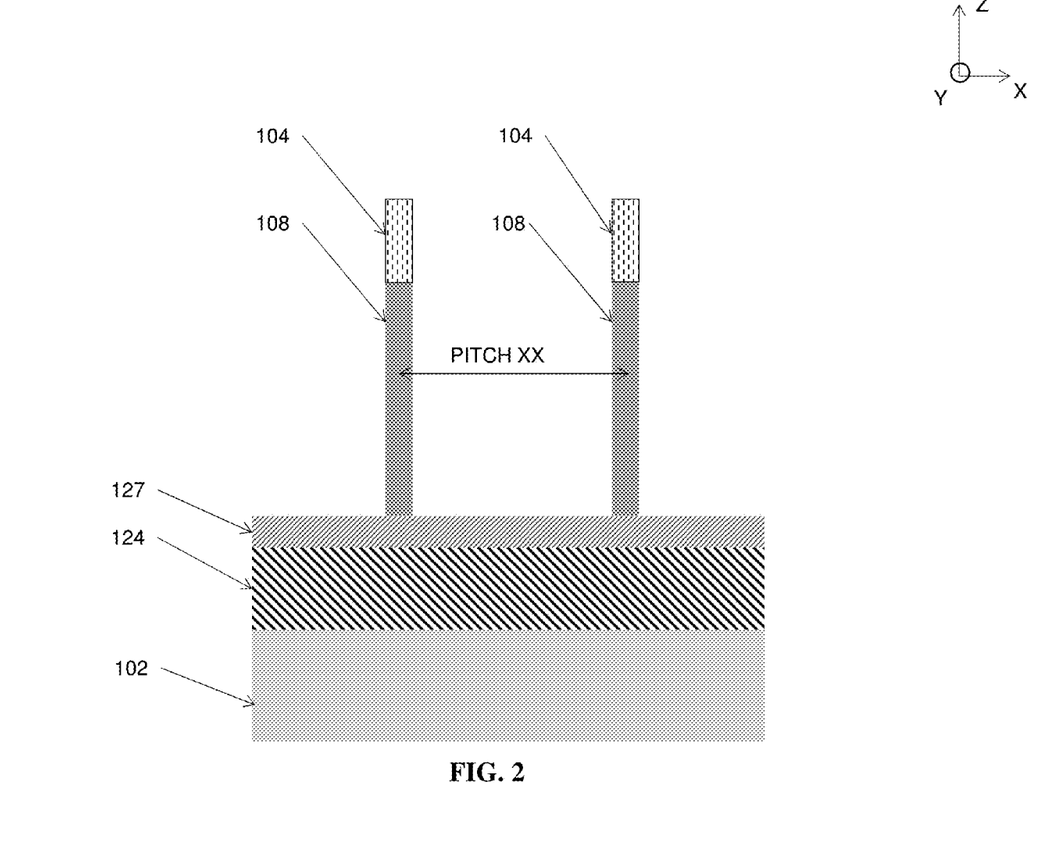
FIG. 2 illustrates the semiconductor structure of FIG. 1 after performing an etching process to transfer patterned trenches into the semiconductor substrate according to a non-limiting embodiment.

Referring now to FIG. 2, the semiconductor structure 100 is illustrated after patterning hardmasks 104 on an upper surface of the semiconductor and performing an etching operation to form a plurality of fins, according to a non-limiting embodiment. An etch is applied to the semiconductor structure 100 to etch into the portions of the intrinsic semiconductor layer 108 that are not covered by the hardmasks 104, thereby forming fins 108. In one non-limiting embodiment, a single etching process selective to a substrate material can be used to etch around the hardmasks 104 while stopping at a predetermined depth. The etching stops at the intrinsic SiGe layer 127. Although two fins 108 are shown, it should be appreciated that any number of fins are contemplated.

According to one non-limiting embodiment, a plurality of fins is formed on the epitaxy of stacked layers, where the fins are formed with a pitch depicted in FIG. 2 as pitch "XX". In one aspect, pitch XX is 40 nm. Other fin spacing is contemplated.

Figure 3:
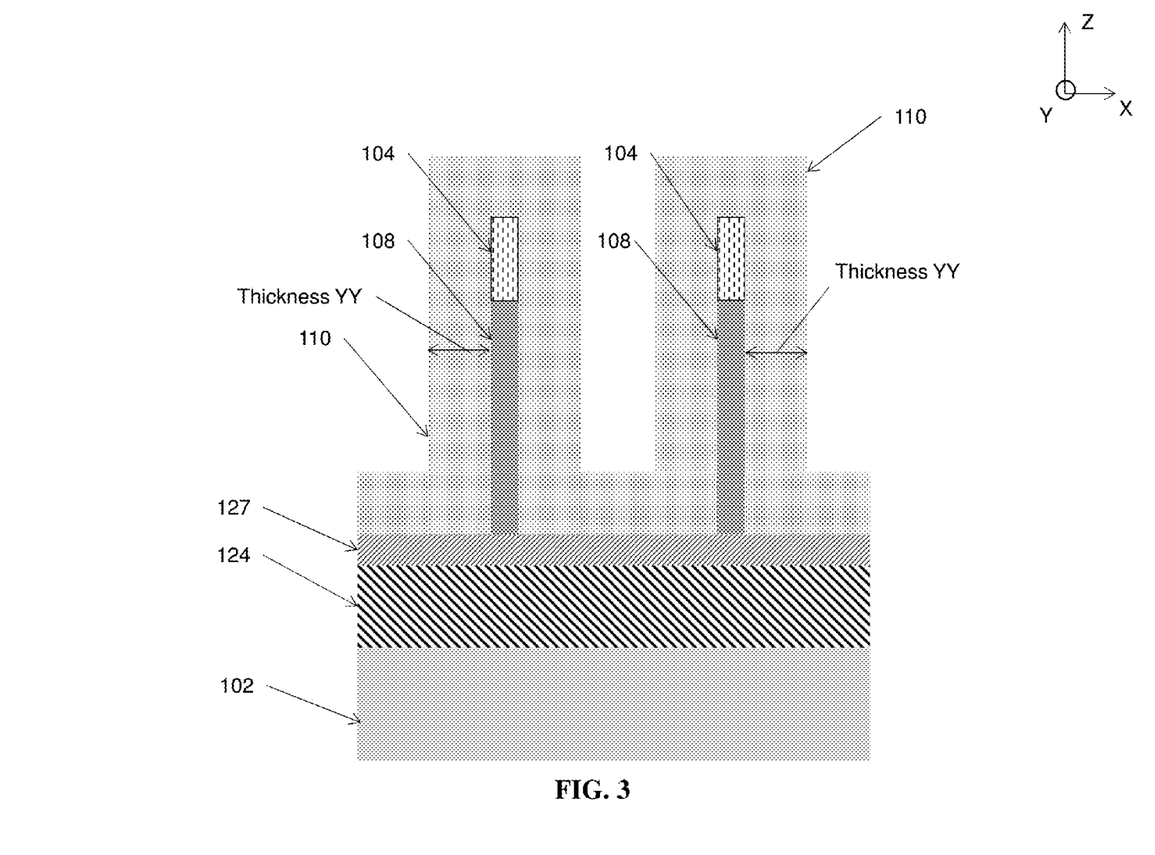
FIG. 3 illustrates the semiconductor structure of FIG. 2 after conformal deposition of amorphous siliconborocarbonitride (SiBCN) according to a non-limiting embodiment.

FIG. 3 depicts forming an amorphous siliconborocarbonitride (SiBCN) spacer hardmask 110 over the pair of fins. In some aspects, SiBCN spacer hardmask 110 is a conformally deposited on intrinsic SiGe layer 127. Any suitable dielectric can be used to form spacer hardmask 110. The dielectrics can be, for example, silicon oxide, silicon nitride, silicon oxynitride, boron nitride, or any combination of these materials. As depicted in FIG. 3, SiBCN spacer hardmask 110 is formed to a thickness depicted as "Thickness YY". In one non-limiting embodiment, SiBCN spacer hardmask 110 can be formed to a thickness YY of 8 nm.

Figure 4:
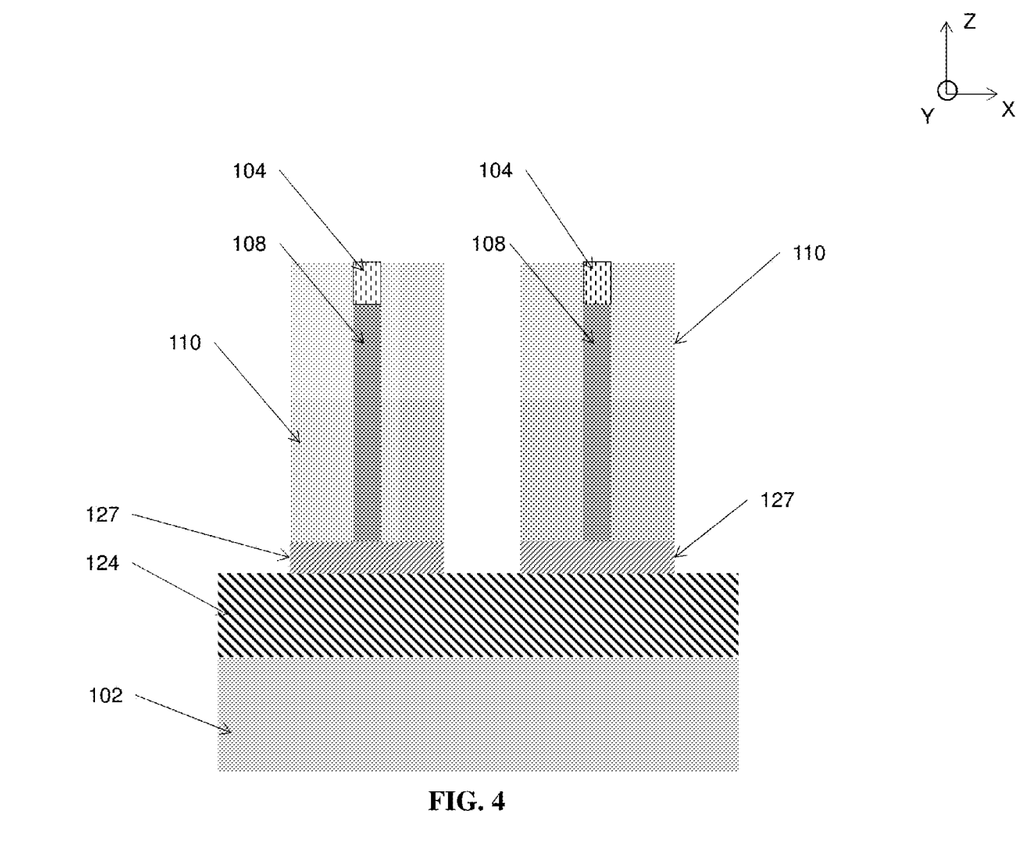
FIG. 4 illustrates the semiconductor structure of FIG. 3 after directional etching of SiBCN and the hardmask material according to a non-limiting embodiment.

FIG. 4 depicts semiconductor structure 100 after a directional etching of SiBCN 110 and the hardmask 104. SiBCN spacer hardmask 110 and the fin hardmask are both directionally and selectively etched at this step. The total fin height is reduced because of over-etching of SiBCN spacer hardmask 110, and hardmask material, to ensure no residue on the exposed planar surfaces.

Figure 5:
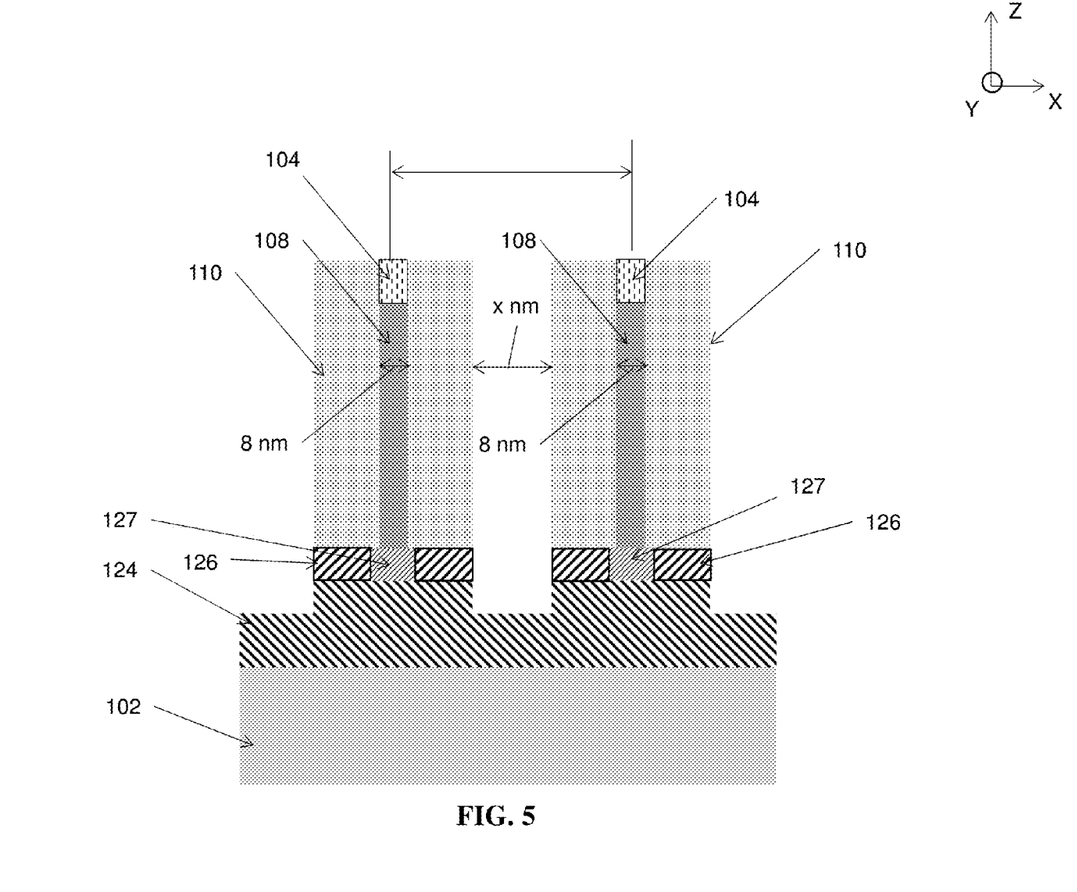
FIG. 5 illustrates the semiconductor structure of FIG. 4 after directional etching to expose a top surface of doped semiconductor layer 124 according to a non-limiting embodiment.

FIG. 5 depicts semiconductor structure 100 after directional etching of semiconductor to expose a top surface of doped semiconductor layer 124. In some aspects, a directional etching step is performed to etch back doped semiconductor layer 124 until intrinsic SiGe layer 127 is completely exposed at the edge. By exposing an edge of SiGe layer 127, selective oxidation of SiGe is performed which forms the bottom spacer 126. In one embodiment, the selectively oxidized bottom spacer 126 has an oxidation depth of 7 nm with less than 1 nm variation in oxidation depth. Oxidation is selective to selectively oxidized bottom spacer 126. As depicted in FIG. 5, fins 108 have a thickness of 8 nm. Other fin thicknesses are contemplated.

Figure 6:
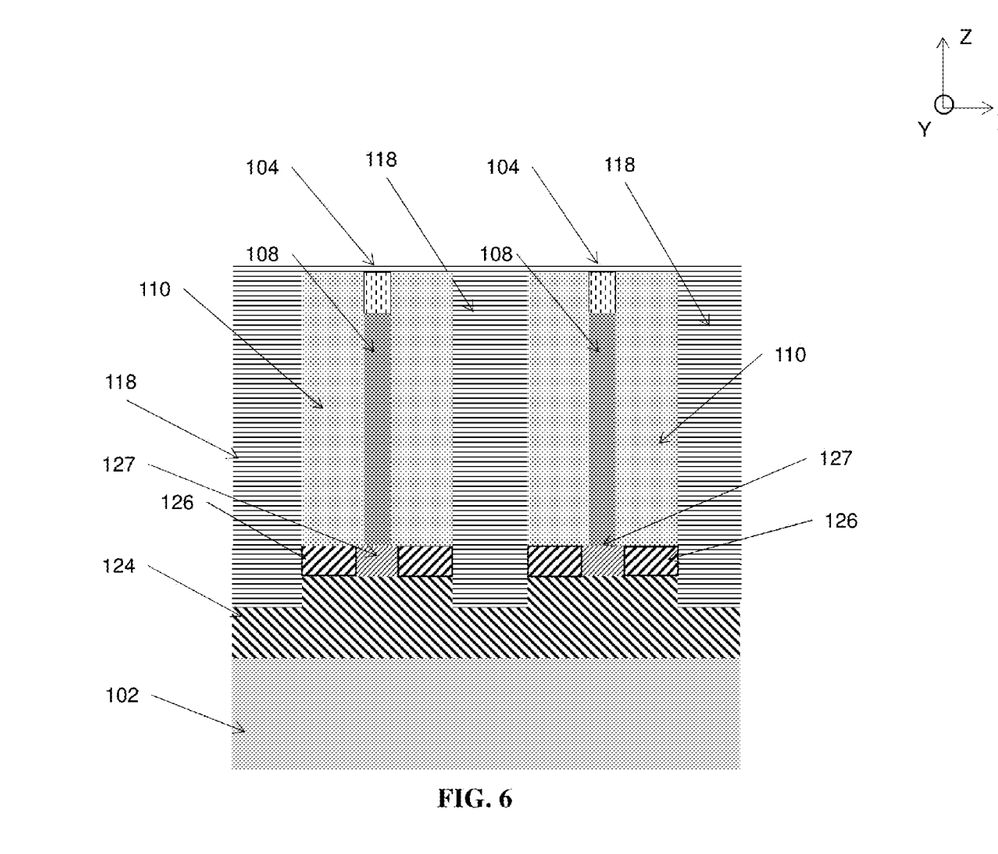
FIG. 6 illustrates the semiconductor structure of FIG. 5 after a dielectric material is deposited to fill the structure according to a non-limiting embodiment.

As shown in FIG. 6, a dielectric material 118 (such as silicon dioxide) is deposited to fill the structure. Dielectric material 118 is then recessed down to the hardmasks 104 using a technique such as chemical-mechanical planarization (CMP). The planarization is performed, at least, to the top surface of the hardmasks 104, exposing a distal surface of the hardmasks 104. The vertical thickness of selectively oxidized bottom spacer 126 can range, for example, from approximately 3 nm to approximately 20 nm. Other thickness is also conceived. If selectively oxidized bottom spacer 126 includes a doped-dielectric material, the dopant concentration in selectively oxidized bottom spacer 126 ranges from $1E19/cm^3$ to $5E21/cm^3$, although lower or higher dopant concentration is also suitable.

Figure 7:
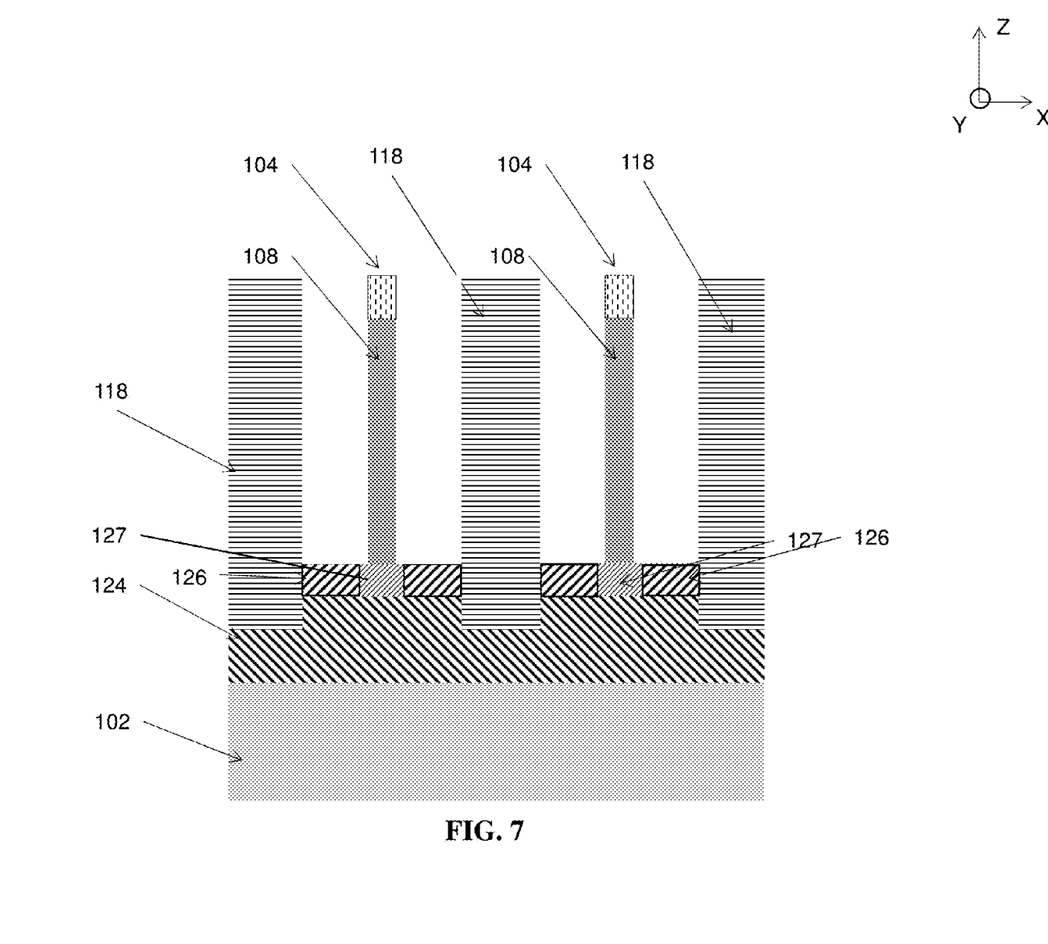
FIG. 7 illustrates the semiconductor structure of FIG. 6 after portions of the SiBCN spacer hardmask have been selectively etched to reopen the inner trenches around each of the fins according to a non-limiting embodiment.

Dielectric material 118 (such as silicon dioxide) is deposited to fill the structure (including deep trenches). Dielectric material 118 is then recessed down to the hardmasks 104 using a technique such as chemical-mechanical planarization (CMP). The planarization is performed, at least, to the top surface of the hardmasks 104, exposing a distal surface of the hardmasks 104. FIG. 7 depicts semiconductor structure 100 where portions of semiconductor substrate 102 have been exposed by a pattern and selective etching technique to reopen inner trenches around each of the fins 108.

FIG. 7 depicts semiconductor structure 100, after portions of SiBCN spacer hardmask 110 have been selective etched to reopen inner trenches 119 around each of the fins 108. After patterning, a second etching process such as, for example, a reactive ion etching (RIE) process selective to dielectric material 118 is performed.

Figure 8:
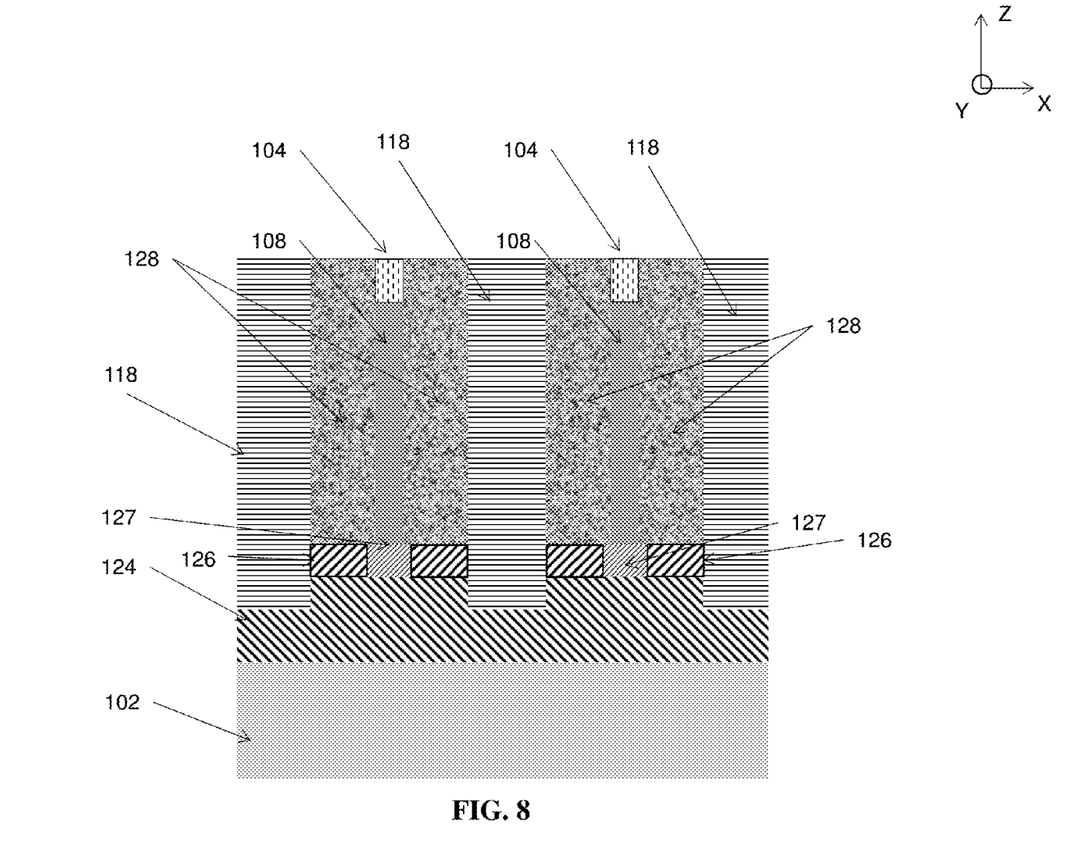
FIG. 8 illustrates the semiconductor structure of FIG. 7 after depositing the gate stacks that fills the inner trenches, and planarizing the structure until the top of hardmasks according to a non-limiting embodiment.

FIG. 8 depicts semiconductor structure 100 after gate stacks 128 are filled in the inner trenches. As shown in FIG. 8, gate stack 128 (including the gate dielectrics and metals) is filled in the inner trenches. Then the structure is planarized via the CMP process which stops on top of the hardmasks 104.

Figure 9:
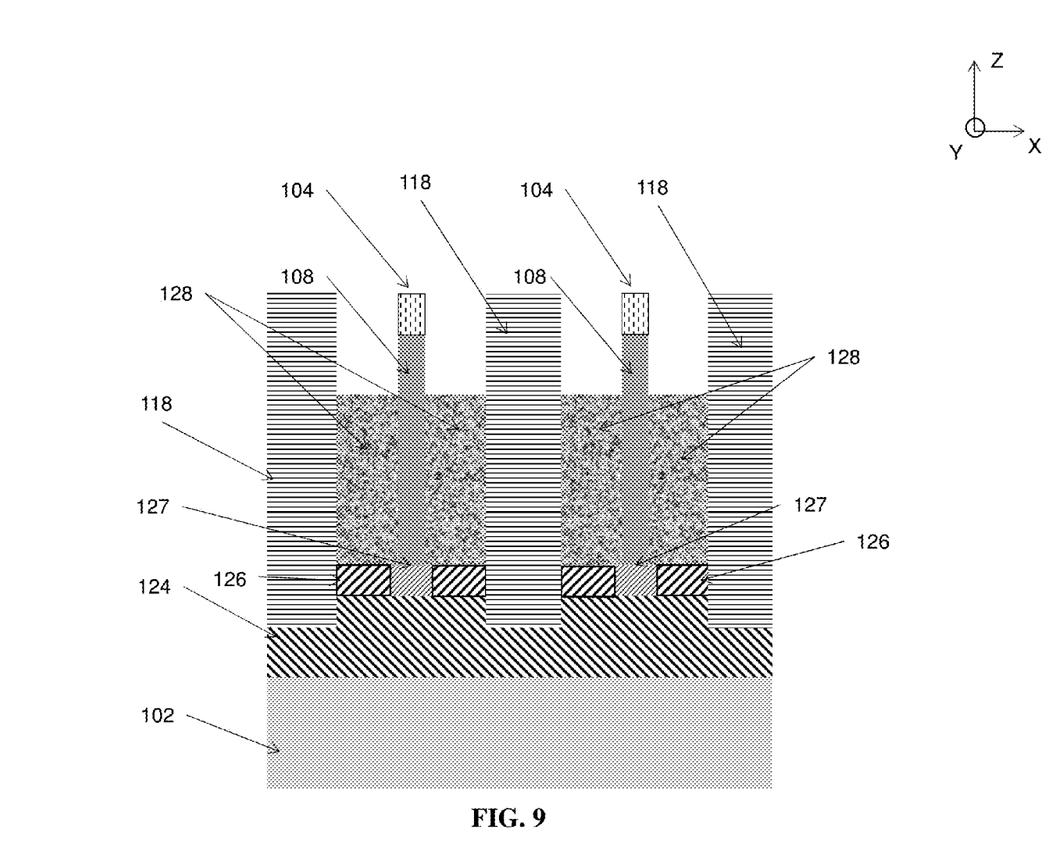
FIG. 9 illustrates the semiconductor structure of FIG. 8 after a gate recess etching operation according to a non-limiting embodiment.

According to a non-limiting embodiment, a conformal deposition process can first be performed to deposit gate dielectrics within the trenches and over the selectively oxidized bottom spacers 126. The gate dielectrics can be, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum. In one non-limiting embodiment, the gate stack 128 includes a thin layer of hafnium oxide ($HfO_2$) having a thickness ranging from approximately 1.5 nm to approximately 10 nm. Another conformal deposition process can then be performed to deposit gate metals within inner trenches 119 and over the gate dielectrics. The gate metals include work-function metals such as titanium nitride, titanium carbide, titanium aluminum carbide, tantalum nitride and tantalum carbide; and conducting metals such as tungsten, aluminum, copper and poly-silicon FIG. 9 depicts semiconductor structure 100 after a gate recess etching operation according to a non-limiting embodiment. In some aspects gate stacks 128 are recessed to a predetermined depth to receive upper spacers 130.

Figure 10:
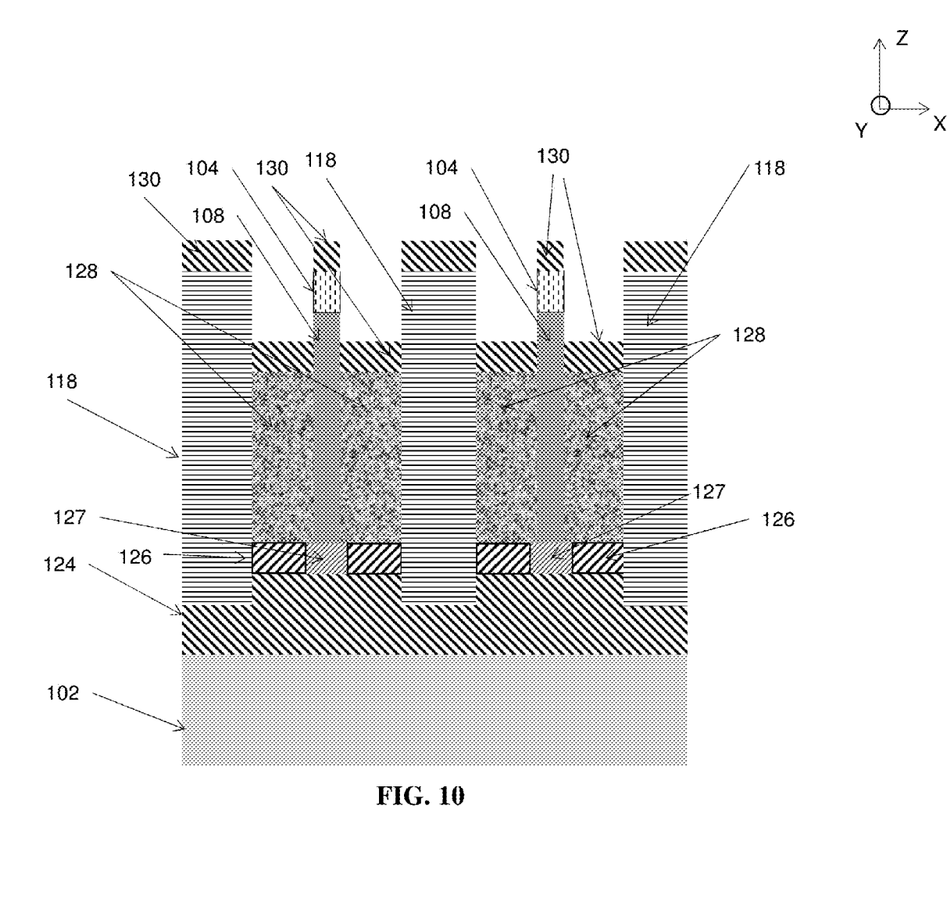
FIG. 10 illustrates the semiconductor structure of FIG. 9 following a directional deposition of a dielectric layer according to a non-limiting embodiment.

As shown in FIG. 10, upper spacers 130 are formed over gate stacks 128 and the hardmasks 104 using, for example, a directional deposition method such as GCIB or HDP. The upper spacers 130 have similar properties with the selectively oxidized bottom spacers 126. The portions of the dielectric layers that are over gate stacks 128 can also serve as upper spacers that protect the gate stacks 128 during subsequent fabrication processes discussed in greater detail below.

Upper spacers 130 can include a doped-dielectric material capable of diffusing its local dopants in response to a thermal anneal process. The dielectric material of the upper spacers 130 can be any suitable material containing dopants such as arsenic (As), phosphorous (P), antimony (Sb) for an n-type transistor, or, in the event of a p-type transistor is desired, boron (B), gallium (Ga). In one non-limiting embodiment, the upper spacers 130 include an n-type doped dielectric material such as, for example, arsenic-doped silicate glass (ASG), phosphorus doped silicate glass (PSG), phosphorus oxide (e.g., $P_2O_5$), or arsenic oxide (e.g., $As_2O_3$). In one non-limiting embodiment, the upper spacers 130 include a p-type doped dielectric material such as, for example, boron-doped silicate glass (BSG), boron oxide (e.g., $B_2O_3$). Other suitable dopant source materials are also suitable. The upper spacers 130 can be deposited by a CVD process such as LPCVD, GCIB, HDP-CVD, PECVD, or ALD, etc.

Figure 11:
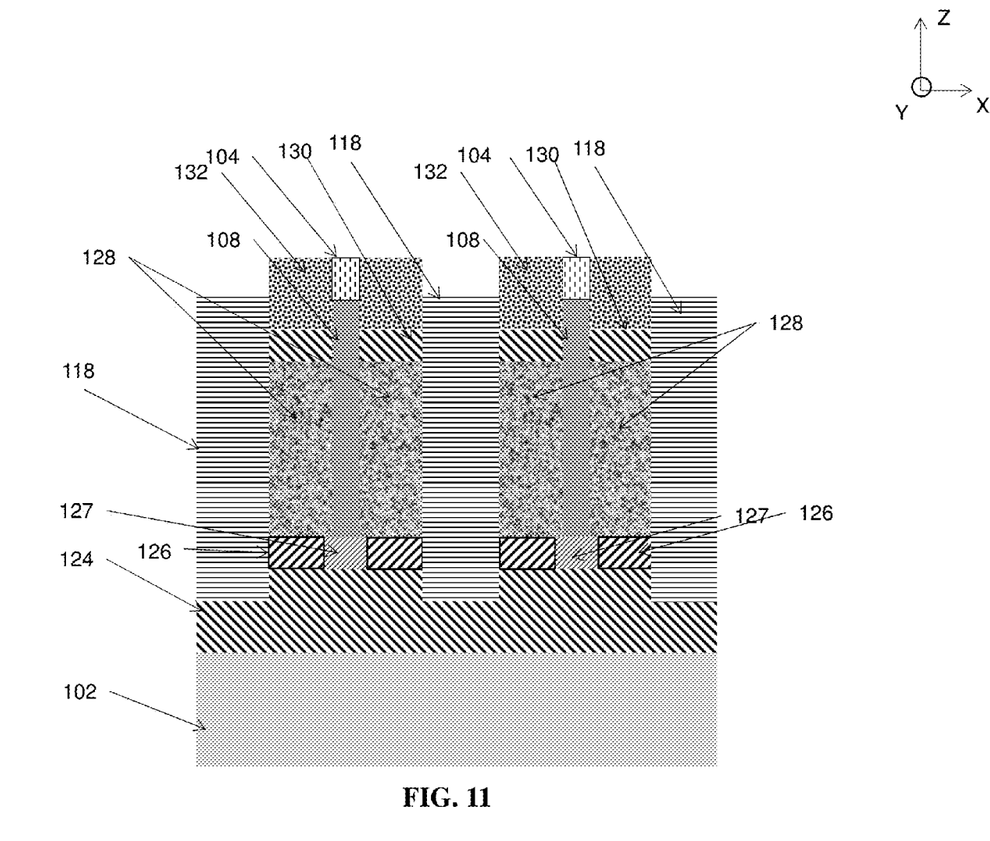
FIG. 11 illustrates the semiconductor structure of FIG. 10 after formation of sacrificial dielectric layer over the upper spacers according to a non-limiting embodiment.

The vertical thickness of upper spacers 130 can range, for example, from approximately 3 nm to approximately 20 nm. Other thickness is also conceived. If the upper spacers 130 include a doped-dielectric material, the dopant concentration in the upper spacers 130 ranges from $1E19/cm^3$ to $5E21/cm^3$, although lower or higher dopant concentration is also suitable FIG. 11 depicts semiconductor structure 100 after formation of sacrificial dielectric layer over upper spacers 130, according to a non-limiting embodiment. As shown in FIG. 11 a sacrificial dielectric layer 132 is filled in the cavities. Then the structure 100 is planarized via a CMP process, which stops on top of the hardmasks 104. Optionally, the dielectric material 118 can then be recessed below the top level of the hardmasks 104. In some embodiments, sacrificial dielectric layer 132 can be OPL.

Figure 12:
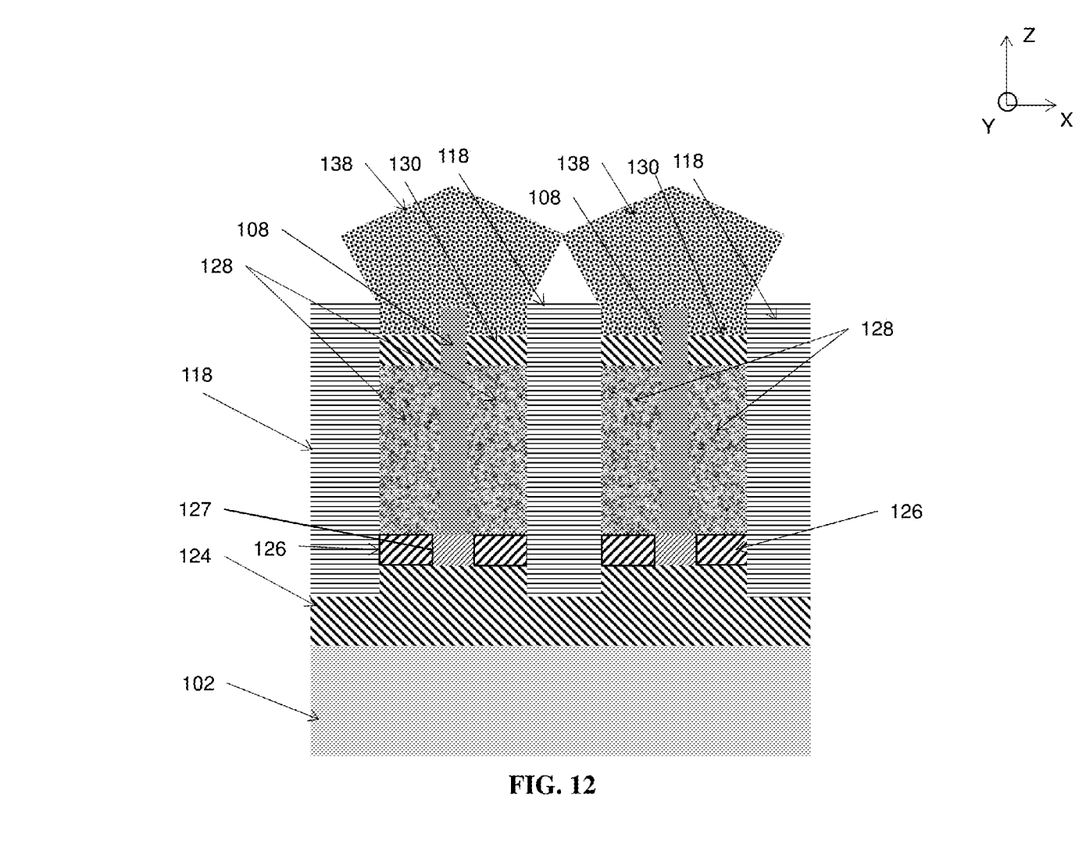
FIG. 12 illustrates the semiconductor structure of FIG. 11 following a selective etching process that removes the sacrificial dielectric layer according to a non-limiting embodiment.

FIG. 12 depicts semiconductor structure 100 after stripping sacrificial dielectric layer 132 with a selective etching process, and formation of top source/drains (S/D) 138. As shown in FIG. 12, sacrificial dielectric layer 132 and the hardmasks 104 have been removed by a selective etch process, thereby revealing the upper surfaces of the upper spacers 130 and the top portions of the fins 108. The doped semiconductor layers, which function as upper S/D regions 138, are epitaxially grown over the top portions of the fins 108 and the upper spacers 130. Upper S/D regions 138 encapsulate the top portions of the fins 108.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a vertical transistor, the method comprising:
    forming at least one fin on stacked layers comprising a substrate, a doped silicon layer, and an intrinsic layer interposed between the at least one fin and the substrate;
    forming a spacer hardmask over the at least one fin; and
    forming a bottom spacer, wherein forming the bottom spacer comprises selective oxidation of the intrinsic layer;
    opening a plurality of gate trenches surrounding the two or more fins; and
    forming a metal gate stack in each of the plurality of gate trenches
        wherein forming the metal gate stack comprises:
        recessing a top portion of the metal gate stack;
        forming a top spacer; and
        forming a top source or drain (S/D) region on the top spacer.

2. The method of claim 1, further comprising:
    forming a shallow trench isolation (STI) interposed between two or more fins.

3. The method of claim 2, comprising two or more fins comprising a fin pitch of no more than 40 nm.

4. The method of claim 2, wherein forming the plurality of gate trenches comprises etching the spacer hardmask at a base of the plurality of gate trenches to expose the doped silicon layer.

5. The method of claim 1, wherein forming the spacer hardmask over the at least one fin comprises conformal deposition of amorphous siliconborocarbonitride (SiBCN).

6. The method of claim 1, wherein the spacer hardmask has a material thickness of 8 nm.

7. The method of claim 1, wherein the S/D region formed on the metal gate stacks comprise a merged S/D region.

8. The method of claim 1, wherein the S/D region formed on the metal gate stacks comprise unmerged source and drain regions.

* * * * *